United States Patent
Kweon et al.

(10) Patent No.: US 10,912,226 B2
(45) Date of Patent: Feb. 2, 2021

(54) WIRELESS BATTERY CHARGING MODULE

(71) Applicants: Hyundai Motor Company, Seoul (KR); Kia Motors Corporation, Seoul (KR); AMOTECH CO., LTD., Incheon (KR)

(72) Inventors: Kyoungchun Kweon, Seoul (KR); Hwi Chul Shin, Suwon-si (KR); Seung Jae Hwang, Incheon (KR); Jong Eun Kim, Suwon-si (KR)

(73) Assignees: Hyundai Motor Company, Seoul (KR); Kia Motors Corporation, Seoul (KR); AMOTECH CO., LTD., Incheon (KR)

( * ) Notice: Subject to any disclaimer, the term of this patent is extended or adjusted under 35 U.S.C. 154(b) by 436 days.

(21) Appl. No.: 15/816,928

(22) Filed: Nov. 17, 2017

(65) Prior Publication Data

US 2018/0177075 A1 Jun. 21, 2018

(30) Foreign Application Priority Data

Dec. 21, 2016 (KR) .................. 10-2016-0175415
Jul. 10, 2017 (KR) .................. 10-2017-0087103

(51) Int. Cl.
| | | |
|---|---|---|
| *H05K 7/20* | (2006.01) | |
| *H02J 50/70* | (2016.01) | |
| *H02J 50/10* | (2016.01) | |
| *H01F 27/22* | (2006.01) | |
| *H01F 27/38* | (2006.01) | |
| *H01F 27/36* | (2006.01) | |
| *H01F 38/14* | (2006.01) | |
| *H02J 7/00* | (2006.01) | |
| *H02J 7/02* | (2016.01) | |
| *H05K 9/00* | (2006.01) | |

(52) U.S. Cl.
CPC ........... *H05K 7/2039* (2013.01); *H01F 27/22* (2013.01); *H01F 27/36* (2013.01); *H01F 27/38* (2013.01); *H01F 38/14* (2013.01); *H02J 7/0042* (2013.01); *H02J 7/025* (2013.01); *H02J 50/10* (2016.02); *H02J 50/70* (2016.02); *H05K 9/0081* (2013.01)

(58) Field of Classification Search
CPC ...... H05K 7/2039; H02J 50/70; H01F 27/365; H01F 27/22
USPC ........................................... 320/108
See application file for complete search history.

(56) References Cited

U.S. PATENT DOCUMENTS

| | | | | |
|---|---|---|---|---|
| 8,541,977 | B2 * | 9/2013 | Hasegawa | H01F 27/2876 320/109 |
| 9,438,067 | B2 * | 9/2016 | Na | H02J 7/025 |
| 9,564,263 | B2 * | 2/2017 | Kuk | H02J 50/80 |

(Continued)

FOREIGN PATENT DOCUMENTS

| | | |
|---|---|---|
| KR | 10-2008-0077560 A | 8/2008 |
| KR | 10-2016-0028384 A | 3/2016 |

(Continued)

*Primary Examiner* — Richard V Muralidar
(74) *Attorney, Agent, or Firm* — Morgan, Lewis & Bockius LLP

(57) ABSTRACT

A wireless charging transmitter module may include a plurality of coil devices, a magnetic field shielding sheet to cover one side of the plurality of coil devices, and a heat dissipation plate to cover the magnetic shielding sheet, so that heat may be more efficiently dissipated through the heat dissipation plate.

11 Claims, 9 Drawing Sheets

(56) References Cited

U.S. PATENT DOCUMENTS

| | | | | |
|---|---|---|---|---|
| 10,447,065 B2* | 10/2019 | Hwang | .................. | H01F 27/22 |
| 2008/0197956 A1* | 8/2008 | Hasegawa | ............... | H01F 38/14 |
| | | | | 336/61 |
| 2014/0210406 A1* | 7/2014 | Na | .......................... | H02J 5/005 |
| | | | | 320/108 |
| 2017/0170678 A1* | 6/2017 | Uhm | ....................... | H02J 50/70 |

FOREIGN PATENT DOCUMENTS

| | | | | |
|---|---|---|---|---|
| KR | 10-2016-0071772 A | 6/2016 | | |
| KR | 10-1690500 B1 | 12/2016 | | |
| KR | 101690500 B1 * | 12/2016 | ............... | H05K 9/00 |

* cited by examiner

WIRELESS BATTERY CHARGING MODULE

CROSS-REFERENCE TO RELATED APPLICATION(S)

The present application claims priority to Korean Patent Application Nos. 10-2016-0175415 and 10-2017-0087103 filed on Dec. 21, 2016 and Jul. 10, 2017, the entire contents of which is incorporated herein for all purposes by this reference.

BACKGROUND OF THE INVENTION

Field of the Invention

The present invention relates to a wireless charging transmitter module and more particularly, to a lightweight wireless charging transmitter module configured for efficiently dissipating heat generated in a coil device.

Description of Related Art

In recent years, the use of wireless charging transmitter modules capable of easily charging a battery of a portable terminal in a vehicle has been increasing.

In the case of wireless charging in vehicles, since a mobile phone needs to be charged in a wide space such as a console box, a wireless charging transmitter module having three coil devices satisfying the WPC(wireless power consortium) standard having a large chargeable area in order to continue charging even when the position of the mobile phone is changed has been used.

Such a wireless charging transmitter module includes a magnetic field absorbing material adapted to absorb a magnetic field generated in a coil unit.

In the conventional automobile industry, a method of placing a coil unit by injecting-molding a SENDUST material having a low permeability as a magnetic field absorbing material is used or a method of attaching a coil unit onto a ferrite thin film with a high permeability has been used.

However, the SENDUST material may have low charging efficiency due to low magnetic permeability. Also, since the ferrite thin film is brittle, it is difficult to place the coil unit by using the ferrite thin film.

Furthermore, high power is required for the wireless charging transmitter module to perform high speed charging. However, high power supplied to the wireless charging transmitter module may generate a large amount of heat more than a proper level of heat in coil devices. Thus, it is difficult to use high power in the wireless charging transmitter module due to a large amount of heat generated by the coil devices, thereby limiting an increase in wireless charging speed.

Therefore, there is a need to develop a material and structural technology capable of stably placing a coil unit on a magnetic field absorbing material having a high permeability, having excellent heat dissipating capability to reduce heat generating even during high speed charging, and minimizing manufacturing variations.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Therefore, various aspects of the present invention are directed to providing a wireless charging transmitter module configured for dissipating heat of a coil device.

Various aspects of the present invention are directed to providing a lightweight wireless charging transmitter module having sufficient magnetic field shielding effect and heat dissipating capability.

Additional aspects of the disclosure will be set forth in part in the description which follows and, in part, will be obvious from the description, or may be learned by practice of the disclosure.

In accordance with one aspect of the present invention, a wireless charging transmitter module including a plurality of coil devices, a magnetic field shielding sheet disposed at one side of the plurality of coil devices, and a heat dissipation plate attached to one side of the magnetic field shielding sheet.

The wireless charging transmitter module may further include a heat dissipation bracket to accommodate the plurality of coil devices, wherein the heat dissipation bracket includes graphite.

The magnetic field shielding sheet may be formed of an Ni—Zn ferrite sheet, and the heat dissipation plate is formed of a metallic material.

The heat dissipation plate is formed of aluminum.

A thickness A of the magnetic field shielding sheet and a thickness B of the heat dissipation plate satisfy a relation "$0<A/B<1$".

The magnetic field shielding sheet may have a thickness of 0.5 mm or less.

The magnetic field shielding sheet may be disposed to cover an exposed surface of the magnetic field shielding sheet covering one surface of the heat dissipation bracket.

The heat dissipation plate may be disposed to cover an exposed surface and external end portions of the magnetic field shielding sheet covering one surface of the heat dissipation bracket.

The plurality of coil devices may include a first coil device disposed on one side of the heat dissipation bracket and a pair of second coil devices disposed side by side on the other side of the heat dissipation bracket, wherein the first coil device and the pair of second coil devices overlap each other.

The heat dissipation bracket may include a first seating groove formed in a first surface and accommodating the first coil device and a pair of second seating grooves formed side by side in a second surface opposite to the first surface and accommodating the pair of second coil devices, the first seating groove and the pair of second seating grooves partially overlap each other to form overlap regions, and the magnetic field shielding sheet is disposed to cover the second surface of the heat dissipation bracket.

At least one portion of the overlap regions is open through the heat dissipation bracket and the first seating groove and the pair of second seating grooves communicate with each other via the open portion.

The first seating groove may have a depth equal to a thickness of the first coil device, and the pair of second seating grooves has a depth equal to a thickness of the pair of second coil devices.

The wireless charging transmitter module may further include a first support portion protruding from the first seating groove to support an internal side of the first coil device and a pair of second support portions protruding from the pair of second seating grooves to support internal sides of the pair of second coil devices.

The first support portion may have a height equal to a depth of the first seating groove and the pair of second support portions has a height equal to a depth of the pair of second seating grooves.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
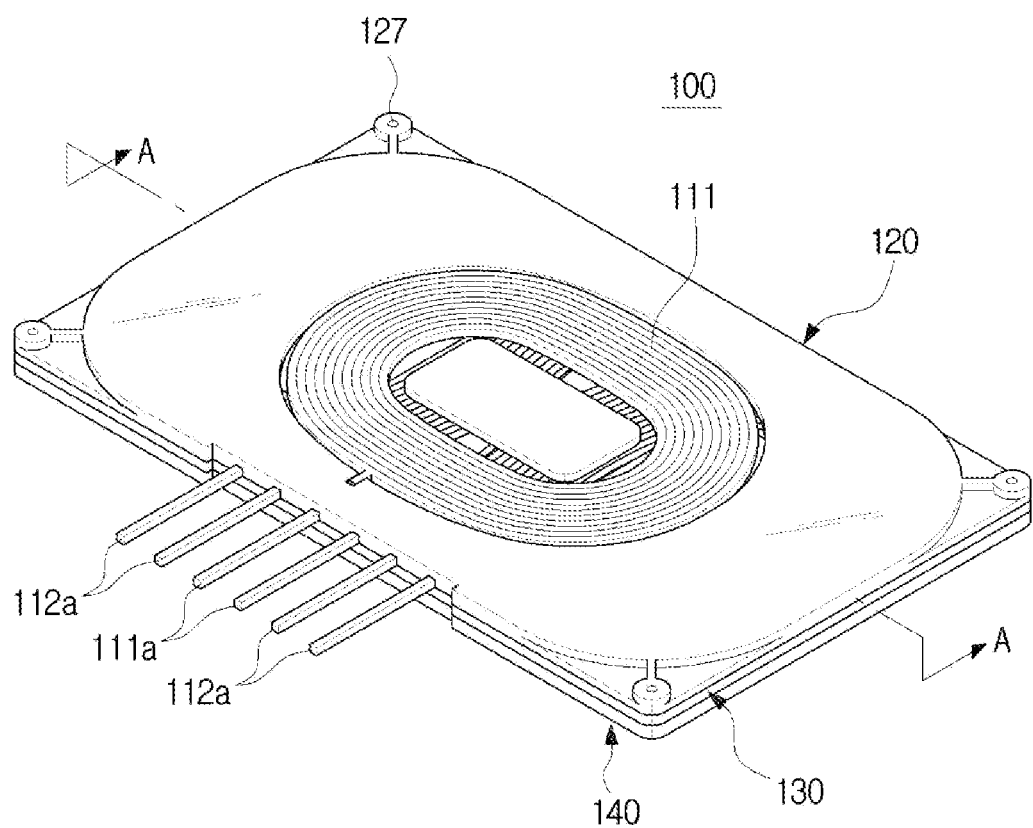
FIG. 1 is a perspective view illustrating a wireless charging transmitter module according to various exemplary embodiments of the present invention.

It may be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Reference will now be made in detail to the exemplary embodiments of the present invention, examples of which are illustrated in the accompanying drawings, wherein like reference numerals refer to like elements throughout. This specification does not describe all elements of the exemplary embodiments of the present invention and detailed descriptions on what are well-known in the art or redundant descriptions on substantially the same configurations may be omitted. The terms 'unit' or 'module' used in the specification may be implemented using a software or hardware component. According to an exemplary embodiment of the present invention, a plurality of 'units' or 'modules' may also be implemented using an element and one 'unit' or 'module' may include a plurality of elements.

Also, it is to be understood that the terms "include" or "have" are intended to indicate the existence of elements disclosed in the specification, and are not intended to preclude the possibility that one or more other elements may exist or may be added.

In the present specification, terms "first," "second," etc. are used to distinguish one component from other components and, therefore, the components are not limited by the terms.

An expression used in the singular encompasses the expression of the plural, unless it has a clearly different meaning in the context.

Hereinafter, operating principles and embodiments of the present invention will be described with reference to the accompanying drawings.

Figure 2:
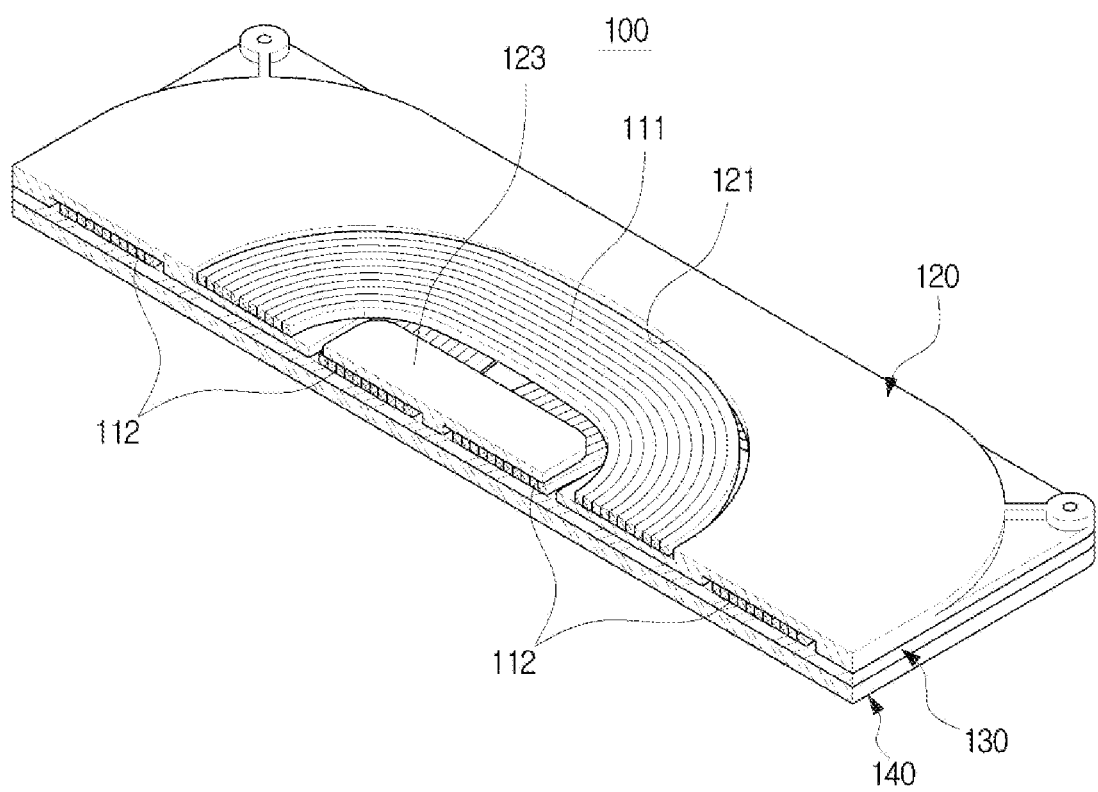
FIG. 2 is a cross-sectional perspective view illustrating the wireless charging transmitter module of FIG. 1 cut in the direction A-A'.
Figure 3:
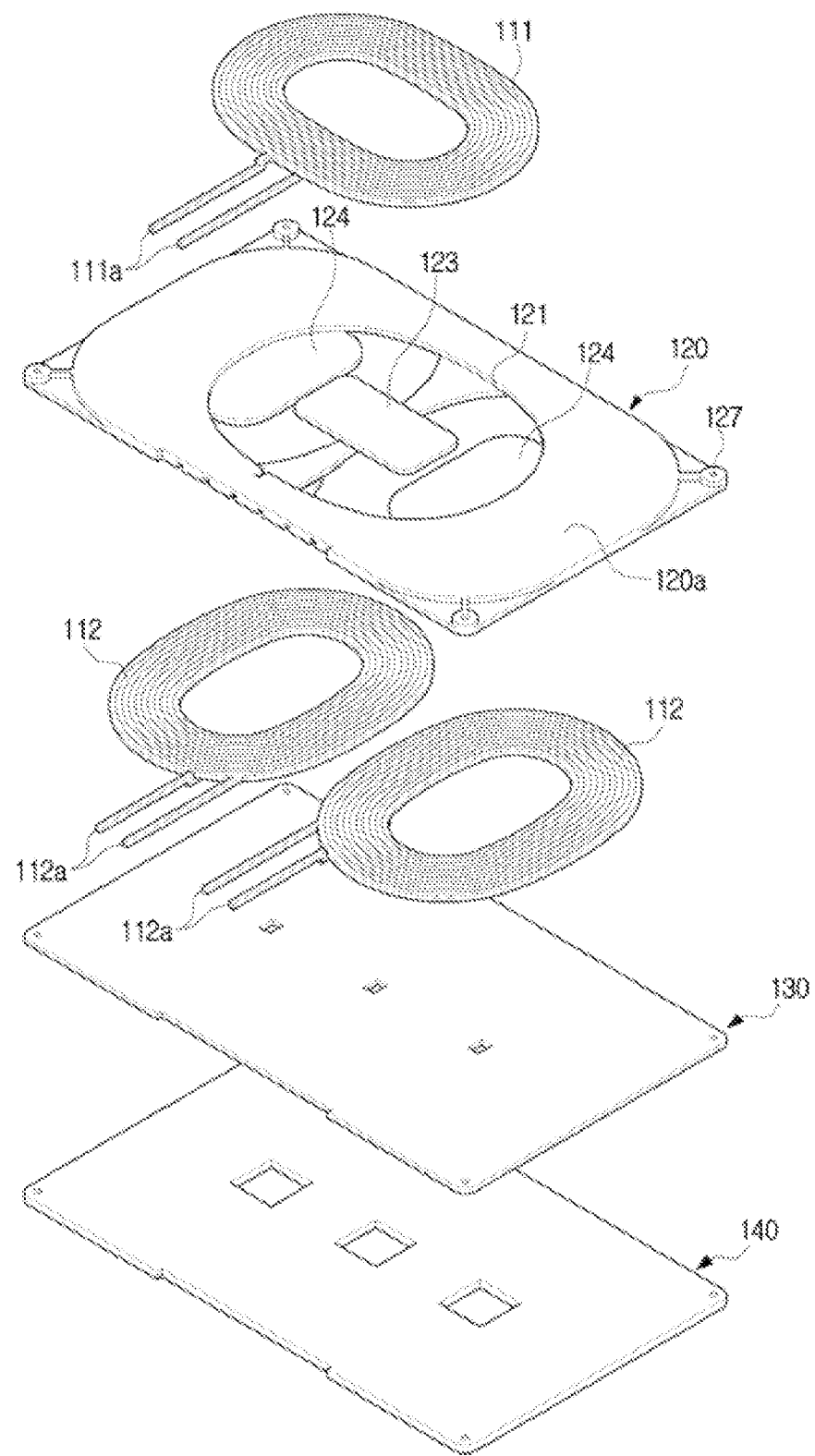
FIG. 3 is an exploded perspective view illustrating the wireless charging transmitter module of FIG. 1.
Figure 4:
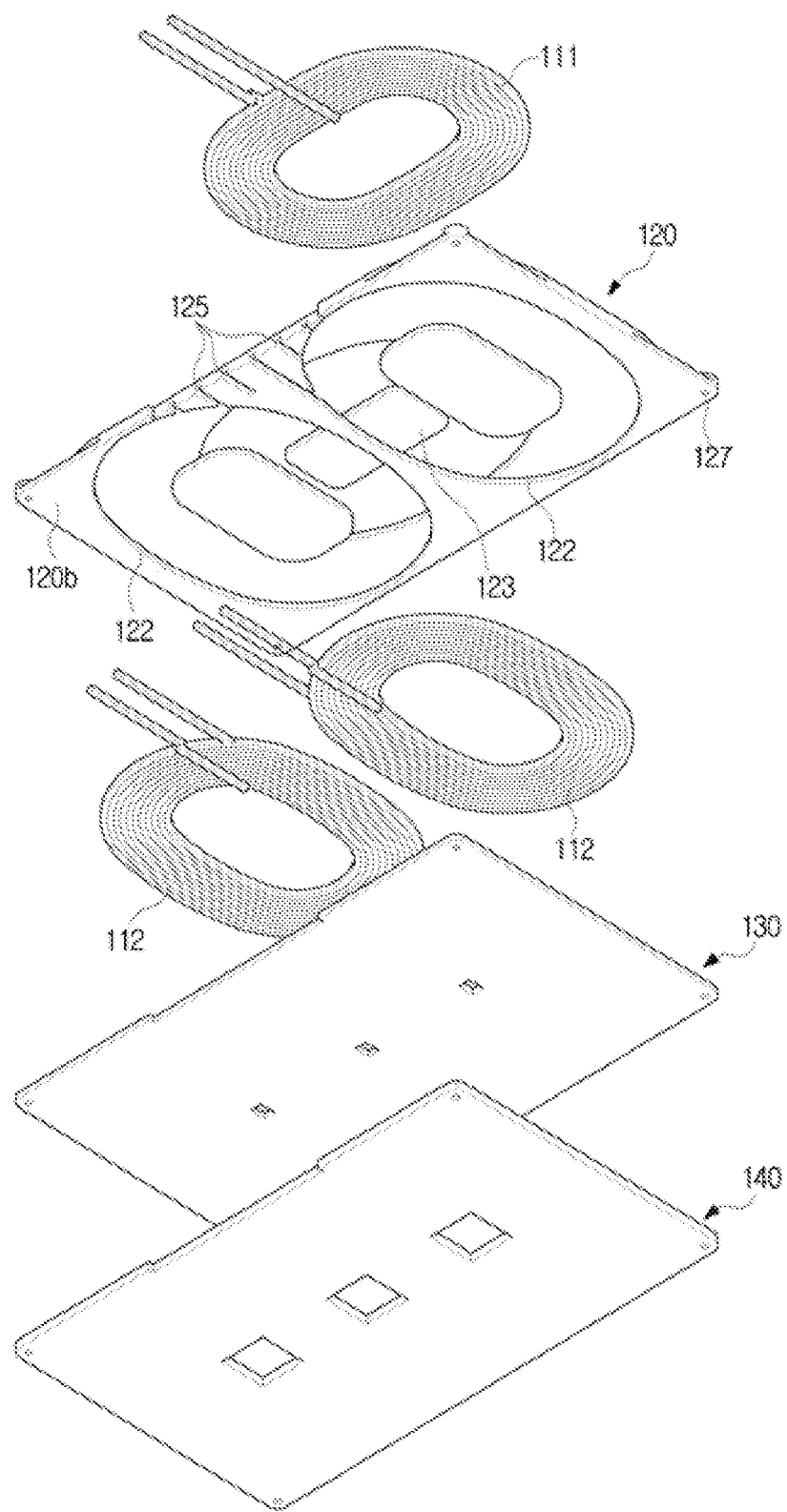
FIG. 4 is a bottom exploded perspective view illustrating wireless charging transmitter module of FIG. 1.

FIG. 1 is a view illustrating one surface of a wireless charging transmitter module according to various exemplary embodiments of the present invention. FIG. 2 is a cross-sectional view of the wireless charging transmitter module of FIG. 1 taken along line AA'. FIG. 3 is an exploded perspective view of the wireless charging transmitter module of FIG. 1 viewed in one direction. FIG. 4 is an exploded perspective view of the wireless charging transmitter module of FIG. 1 viewed in another direction.

Referring to FIGS. 1 to 4, a wireless charging transmitter module 100 according to the various exemplary embodiments of the present invention includes a plurality of coil devices 111 and 112, a heat dissipation bracket 120, a magnetic field shielding sheet 130, and a heat dissipation plate 140.

The wireless charging transmitter module 100 according to the present embodiment transmits wireless power to an electronic device that requires charging. In this regard, the electronic device may be a portable electronic device including a cellular phone, a personal digital assistant (PDA), a portable multimedia player (PMP), a tablet PC, and a multimedia device. Furthermore, the wireless charging transmitter module 100 may be provided or disposed in a vehicle.

The coil devices 111 and 112 transmit wireless power to the electronic device that requires the power. The coil devices 111 and 112 serve as transmitter coils that transmit wireless power to a receiver coil built in the electronic device. In the instant case, inductive coupling based on electromagnetic induction may be applied thereto. The coil devices 111 and 112 may be configured in various forms, for example, may be flat coils.

The electronic device may include a separate receiving antenna (e.g., receiver coil Rx coil) corresponding to the coil devices 111 and 112. A current is induced in the receiving antenna via a magnetic field varying in the coil devices 111 and 112, and thus power is transmitted thereto.

The coil devices 111 and 112 may operate in accordance with Qi standards, PMA standards, or a combination of Qi and PMA standards.

The coil devices 111 and 112 may have a flat circular, oval, or quadrangular shape fabricated by winding a conductive member including a pair of connection terminals at opposite end portions thereof and having a predetermined length either clockwise or counterclockwise plural times. In this regard, the conductive member may be a metal having conductivity including copper or a strand of a plurality of wires each having a predetermined diameter and twisted in a longitudinal direction thereof.

Figure 5:
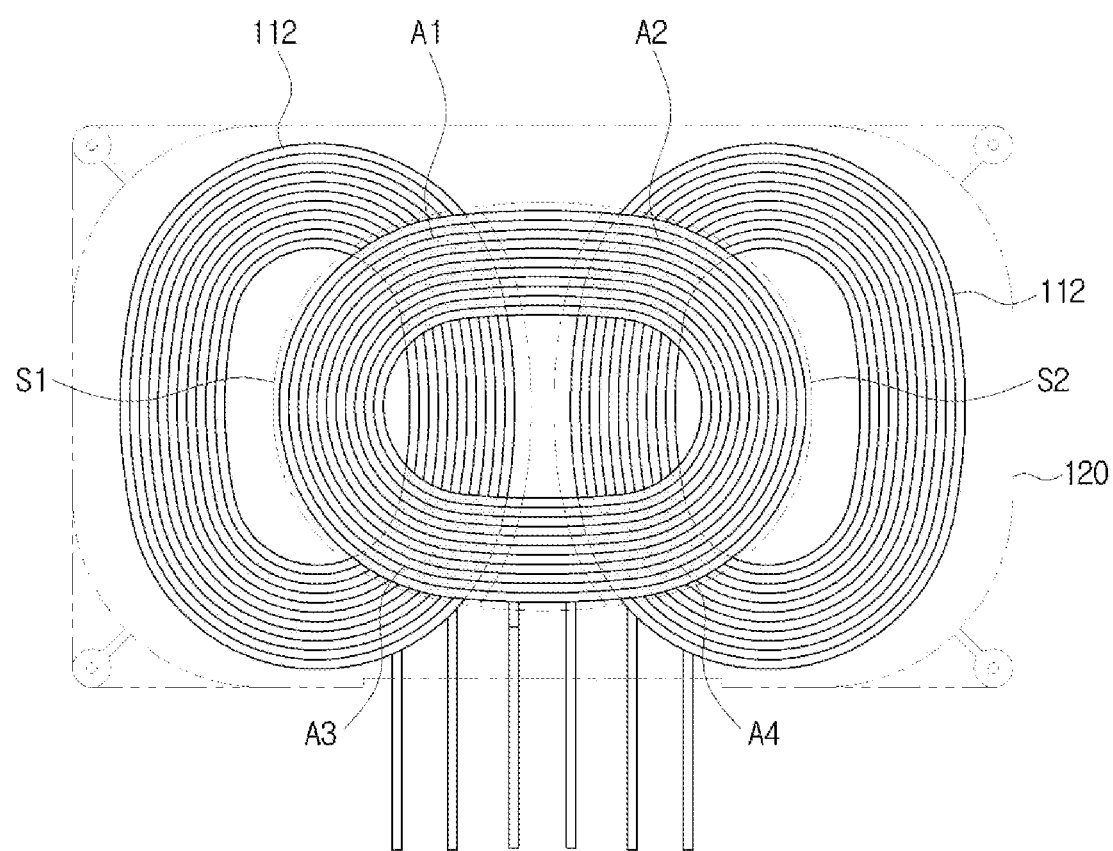
FIG. 5 is a plan view illustrating a stacked state of a plurality of coil devices in the wireless charging transmitter module according to the various exemplary embodiments of the present invention.

The coil devices 111 and 112 may be provided plural in number and the plurality of coil devices 111 and 112 may be stacked to overlap each other by at least one portion. FIG. 5 exemplarily illustrates a structure in which the plurality of coil devices 111 and 112 are stacked to partially overlap each other and WPC A13 standard coils are exemplarily illustrated therein.

As illustrated in FIG. 5, the coil devices 111 and 112 may be provided three in number. One coil device 111 of the three coil devices 111 and 112 may be disposed on the other two coil devices 112 such that the coil device 111 partially overlaps both of the two coil devices 112 at portions A1, A2, A3, and A4.

Hereinafter, the one coil device 111 will be referred to as a first coil device 111 and the other two coil devices 112 disposed on the same plane will be referred to as a pair of second coil devices 112 for descriptive convenience. However, arrangement of the coil devices is not limited to the coupled and disposed relationships illustrated in FIG. 5 and vertical arrangement of the first coil device 111 and the second coil devices 112 and a total number of coil devices may vary in various ways.

The heat dissipation bracket 120 is provided to fix positions of the plurality of coil devices 111 and 112. That is, when the plurality of coil devices 111 and 112 are stacked to partially overlap each other, the overlap regions between the coil devices 111 and 112 may be located at desired positions and have desired areas.

Referring to FIG. 3 and FIG. 4, the heat dissipation bracket 120 may be formed of a planar member having a first surface 120a and a second surface 120b opposite to each other and a predetermined area. The first surface 120a and the second surface 120b may respectively have at least one seating groove 121 and 122 recessed to a predetermined depth.

According to the present embodiment, a plurality of seating grooves 121 and 122 include a first seating groove 121 to accommodate the first coil device 111 disposed at an upper layer and two second seating grooves 122 to respectively accommodate the two second coil devices 112 disposed on the same plane among the plurality of coil devices 111 and 112.

Figure 6:
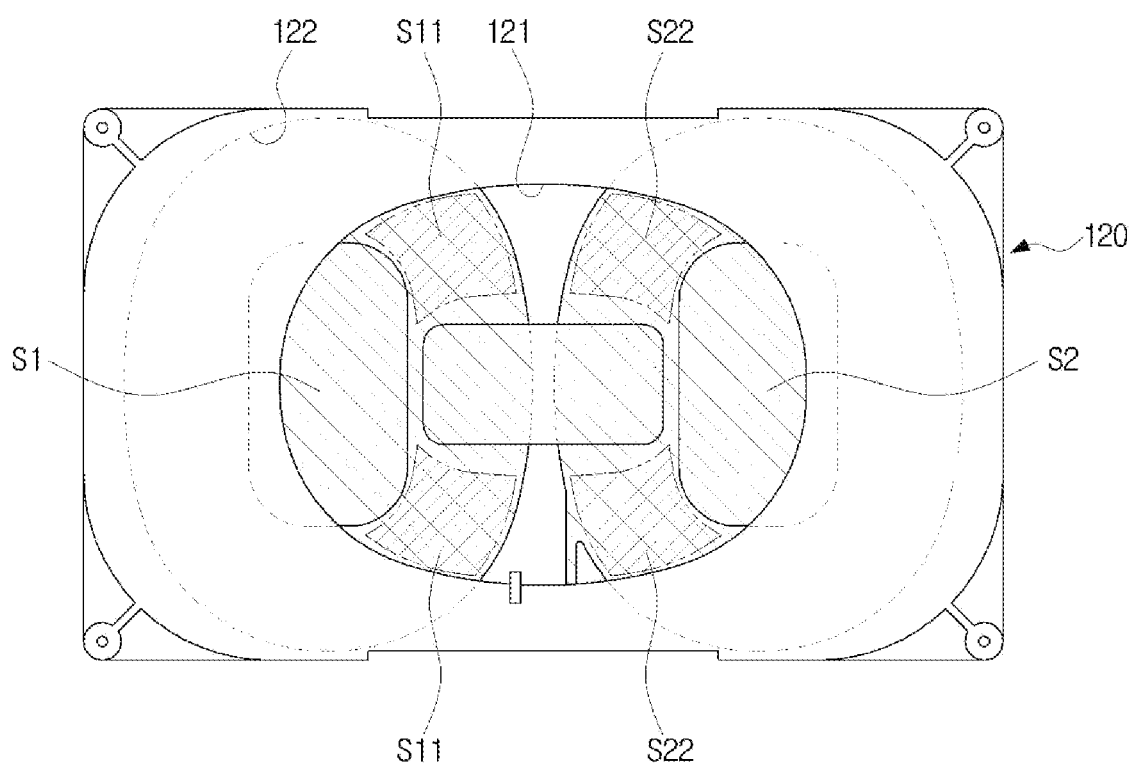
FIG. 6 is a plan view illustrating an exemplary embodiment of forming a seating groove in the wireless charging transmitter module according to the various exemplary embodiments of the present invention.

FIG. 6 exemplarily illustrates a plurality of seating grooves 121 and 122.

Referring to FIG. 6, the first seating groove 121 and the second seating grooves 122 are disposed at opposite sides. That is, the first seating groove 121 is disposed in the first surface 120a of the heat dissipation bracket 120 and the second seating grooves 122 are disposed in the second surface 120b of the heat dissipation bracket 120.

Furthermore, the first seating groove 121 and the second seating grooves 122 are formed in the first surface 120a and the second surface 120b, respectively, to overlap each other at one or more areas to form overlap regions S1 and S2.

Thus, when a worker inserts the first coil device 111 into the first seating groove 121 and the second coil devices 112 into the second seating grooves 122 respectively, the first coil device 111 is aligned to partially overlap each of the second coil devices 112 at positions corresponding to partial regions S11 and S22 of the aforementioned overlap regions S1 and S2.

In the instant case, the partial regions S11 and S22 of the overlap regions S1 and S2 are open through the heat dissipation bracket 120. Thus, the first seating groove 121 communicates with the second seating grooves 122 via the partial regions S11 and S22 of the overlap regions S1 and S2 so that the first coil device 111 disposed in the first seating groove 121 partially contacts with the second coil devices 112 disposed in the second seating grooves 122.

Thus, the coil devices 111 and 112 may simply be aligned in a desired manner with no separate aligning process by designing positions and areas of the overlap regions in accordance with required standards during a process of forming the first seating groove 121 and the second seating grooves 122.

Also, the heat dissipation bracket 120 may include support portions 123 and 124 respectively protruding from the central regions of the first seating groove 121 and the second seating grooves 122 to correspond empty spaces of the central regions of the coil devices 111 and 112.

The support portions 123 and 124 may include a first support portion 123 protruding from a bottom surface of the first seating groove 121 to a predetermined height at the central region of the first seating groove 121 and second support portions 124 protruding from bottom surfaces of the second seating grooves 122 to a predetermined height at the central regions of the second seating grooves 122.

In the instant case, the first support portion 123 and the second support portions 124 may have a height equal to the depth of the seating grooves 121 and 122.

After the coil devices 111 and 112 are inserted, the support portions 123 and 124 may be located at the empty spaces of the central regions of the coil devices 111 and 112 to be in contact with internal sides of the coil devices 111 and 112, respectively. Thus, the internal sides of the coil devices 111 and 112 inserted into the seating grooves 121 and 122 are respectively supported by the support portions 123 and 124 and external sides thereof may be supported by internal walls of the seating grooves 121 and 122. Accordingly, the positions of the first coil device 111 and the second coil devices 112 are fixed by the seating grooves 121 and 122, such that the coil devices 111 and 112 are not dislocated even while the wireless charging transmitter module 100 is shaken, e.g., while a vehicle is running.

In the instant case, the support portions 123 and 124 may have shapes and areas corresponding to the empty spaces of the central regions of the coil devices 111 and 112. Accordingly, some areas of the support portions 123 and 124 are disposed in overlap regions of the first seating groove 121 and the second seating grooves 122, and the other areas are disposed in portions where the first seating groove 121 and the second seating grooves 122 do not overlap.

Thus, the overlap regions S1 and S2 of the first support portion 123 formed in the first seating groove 121 are in direct contact with portions of the second coil devices 112 disposed in the second seating grooves 122 by some areas to support the portions of the second coil devices 112 disposed in the second seating grooves 122. Also, the overlap regions S1 and S2 of the second support portions 124 formed in the second seating grooves 122 are in direct contact with a portion of the first coil device 111 disposed in the first seating groove 121 by some areas to support the portion of the first coil device 111 disposed in the first seating groove 121.

Meanwhile, the heat dissipation bracket 120 includes a material having heat dissipation capability, which will be described later, to provide heat dissipation function. In the instant case, since one surface of each of the coil devices 111 and 112 contacts the heat dissipation bracket 120 at portions thereof except for the overlap regions A1, A2, A3, and A4, contact areas of the coil devices 111 and 112 with the heat dissipation bracket 120 may be maximized such that heat generated by the coil devices 111 and 112 is rapidly distributed via the heat dissipation bracket 120. In this regard, the heat dissipation function of the heat dissipation bracket 120 will be described later.

Meanwhile, the first seating groove 121 and the second seating grooves 122 may have a depth equal to a thickness of the coil devices 111 and 112. The heat dissipation bracket 120 may has a thickness equal to a total thickness of the stacked two coil devices 111 and 112. That is, the thickness of the heat dissipation bracket 120 may be the same as a sum of a thickness of the first coil device 111 and a thickness of the second coil devices 112.

Thus, according to the present embodiment, the plurality of coil devices 111 and 112 may be simply aligned without increasing the thickness of the wireless charging transmitter module 100 even when the heat dissipation bracket 120 is used to align the positions of the plurality of coil devices 111 and 112.

Also, since one surface of the heat dissipation bracket 120 including the surfaces of the coil devices 111 and 112 has a horizontal surface after the coil devices 111 and 112 are accommodated in the seating grooves 121 and the second seating grooves 122 formed in the heat dissipation bracket 120, a contact area between the heat dissipation bracket 120 and the magnetic field shielding sheet 130 may increase.

Accordingly, since the magnetic field shielding sheet 130 is supported by the heat dissipation bracket 120, the magnetic field shielding sheet 130 may be used in a sheet form including a flexible or brittle material.

Meanwhile, guide grooves 125 to accommodate a pair of connection terminals 111a and 112a respectively provided at the coil devices 111 and 112 may be formed on at least one surface of the heat dissipation bracket 120. The guide grooves 125 may be formed to communicate with at least one of the first seating groove 121 and the second seating grooves 122 such that the connection terminals 111a and 112a of the coil devices 111 and 112 are appropriately disposed in the corresponding seating grooves 121 and 122, respectively. For example, the guide grooves 125 may be formed on the second surface 120b of the heat dissipation bracket 120. However, the surface on which the guide grooves 125 are formed is not limited to the second surface 120b.

The guide grooves 125 may have a height similar to the diameter of the conductive member constituting the coil devices 111 and 112 such that one surface of each of the first coil device 111 and the second coil devices 112 completely contacts one surface of the magnetic field shielding sheet 130 in the case where the magnetic field shielding sheet 130 is disposed on one surface of the heat dissipation bracket 120.

Meanwhile, the heat dissipation bracket 120 applied to the wireless charging transmitter module 100 may include a heat dissipating material to rapidly distribute heat generated by the coil devices 111 and 112 during the operation of the coil devices 111 and 112 in addition to the functions of easily aligning the coil devices 111 and 112 and fixing the positions thereof.

Figure 7:
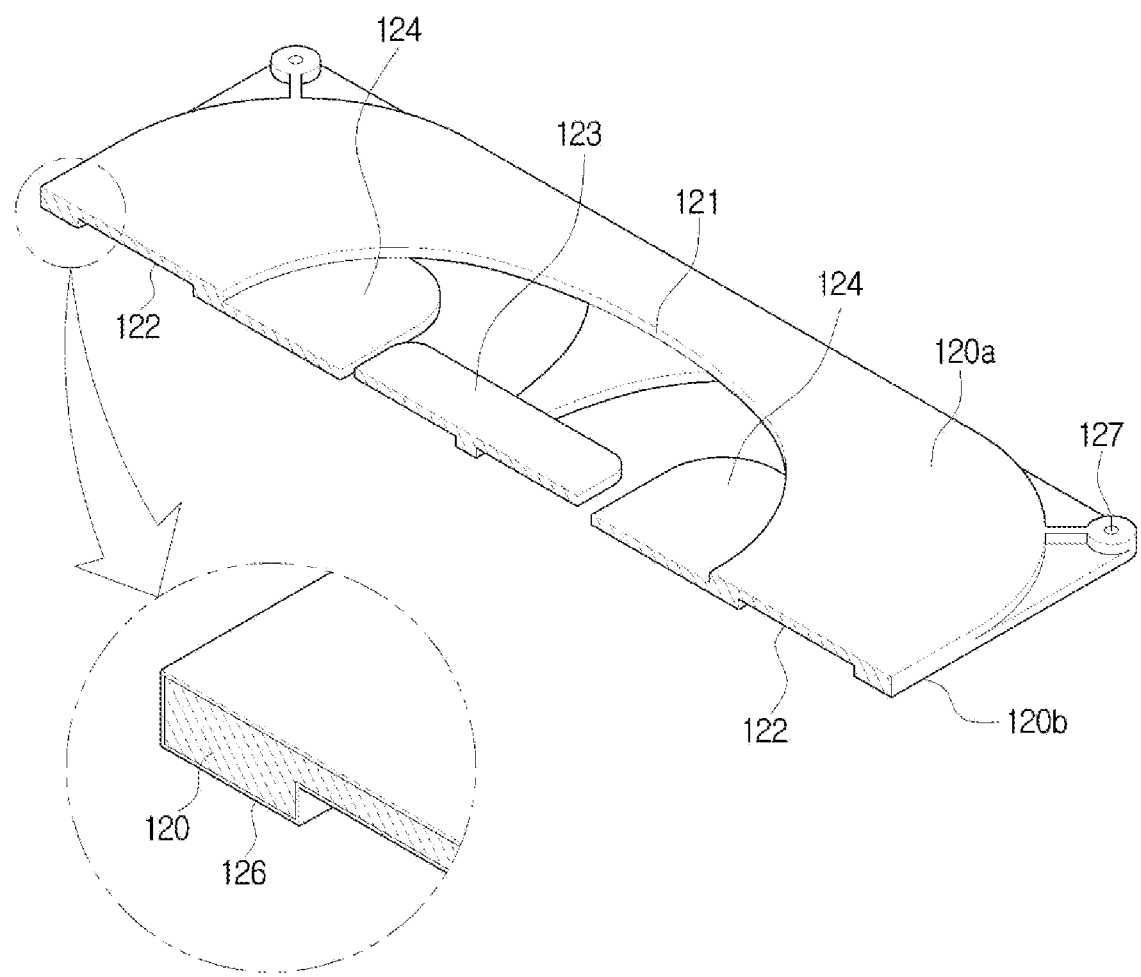
FIG. 7 is a cross-sectional perspective view illustrating a heat dissipation bracket according to various exemplary embodiments of the present invention.

FIG. 7 is a diagram illustrating a heat dissipation bracket 120 according to various exemplary embodiments of the present invention.

The heat dissipation bracket 120 according to the present embodiment has a coating layer 126 having heat dissipating capability on the external surface thereof.

In the instant case, the heat dissipation bracket 120 may include a plastic material having heat dissipating capability or a coating layer 126 having heat dissipating capability may further be formed on the heat dissipation bracket 120 formed of the plastic material having heat dissipating capability.

The coating layer 126 having heat dissipating capability may be formed using a coating composition in which an epoxy resin and graphite are mixed.

However, types of the coating layer 126 are not limited thereto. The epoxy resin may include a thermally conductive filler including a carbonaceous filler, graphene, carbon nanotube, boron nitride, and the like.

Furthermore, as the plastic material having heat dissipation capability, a material prepared by adding graphite to a base resin may be used. In this regard, the base resin may include at least one selected from a polycarbonate (PC) resin, an acrylonitrile-butadiene-styrene (ABS) resin, a PA6 resin, a PA66 resin, a polypropylene (PP) resin, and a PBT resin. According to an exemplary embodiment of the present invention, dopamine-coated nickel (Ni) may further be added to the base resin in addition to graphite.

According to the present embodiment, the heat dissipation bracket 120 is formed of a material prepared by adding graphite to a base resin.

However, the coating layer 126 for heat dissipation and/or the heat dissipating plastic material are not limited thereto and any known coating agents and heat dissipating plastic materials commonly used in the art for heat dissipation may also be used herein.

Meanwhile, the heat dissipation bracket 120 may have at least one coupling hole to be coupled with another member. A coupling member including a bolt member may be coupled to the coupling hole or pass therethrough.

When the heat dissipation bracket 120 is formed of a plastic material, a metallic member having a predetermined area may be partially embedded in the heat dissipation bracket 120 to prevent destruction of the heat dissipation bracket 120 while being coupled to another part via the coupling member and the coupling hole may be formed at a position corresponding to the metallic member. Thus, a binding force and durability of the heat dissipation bracket 120 may be improved. In this regard, the metallic member may be integrated with the heat dissipation bracket 120 by insert molding. However, methods of coupling the metallic member with the heat dissipation bracket 120 are not limited thereto.

The magnetic field shielding sheet 130 is disposed on one surface of each of the coil devices 111 and 112 to shield a magnetic field generated by wireless power signals in the coil devices 111 and 112 and to concentrate the magnetic field in a desired direction.

The magnetic field shielding sheet 130 may be formed of a planar member having a predetermined area to cover the second surface 120b of the heat dissipation bracket 120. The magnetic field shielding sheet 130 may be formed of a magnetic material to shield the magnetic field and concentrate the magnetic field in a desired direction.

The magnetic field shielding sheet 130 may include a SANDUST sheet prepared by adding a polymer to SANDUST (Fe—Si—Al) powder configured for shielding a magnetic field, a Mn—Zn ferrite sheet, an Ni—Zn ferrite sheet, or the like.

Since the SANDUST sheet needs to have a thickness of 2.3 mm or greater to provide sufficient magnetic field shielding effects in the wireless charging transmitter module 100, it is difficult to produce a thin film thereof. Thus, the use of the SANDUST sheet increases volume and weight of the wireless charging transmitter module 100.

Although the Mn—Zn ferrite sheet may be prepared thinner than the SANDUST sheet, the weight reducing effect thereof is negligible.

Thus, an Ni—Zn ferrite sheet is used as the magnetic field shielding sheet 130 according to the present embodiment.

The Ni—Zn ferrite sheet is thinner and lighter than the Mn—Zn ferrite sheet. According to a test result obtained using the same coil devices 111 and 112, an Ni—Zn ferrite sheet having a thickness of 1.6 mm exhibits shielding effects similar to those of a SANDUST sheet having a thickness of 2.3 mm. Furthermore, when the Ni—Zn ferrite sheet having the above thickness is used, a weight reduction effect of about 32% is obtained in comparison with the SANDUST sheet.

Furthermore, the Ni—Zn ferrite sheet is subjected to a plate process for crushing into fine pieces after sintering to obtain flexibility. Thus, when the Ni—Zn ferrite sheet is used as the magnetic field shielding sheet 130, damage to the magnetic field shielding sheet 130 due to an external impact and a change in magnetic properties may be prevented.

The magnetic field shielding sheet 130 that covers one surface of the heat dissipation bracket 120 includes one surface corresponding to the surface of the heat dissipation bracket 120 and the other surface opposite thereto and exposed to the outside. The heat dissipation plate 140 that facilitates diffusion of heat is disposed on the exposed surface of the magnetic field shielding sheet 130. The heat dissipation plate 140 is disposed such that one surface thereof covers the exposed surface of the magnetic field shielding sheet 130.

Thus, heat generated in the coil devices 111 and 112 may be rapidly diffused and dissipated through the heat dissipation plate 140.

The heat dissipation plate 140 is formed of a planar member having a predetermined area corresponding to the magnetic field shielding sheet 130 and disposed to cover an external surface of the magnetic field shielding sheet 130. The heat dissipation plate 140 is formed of a metal having a high thermal conductivity. For example, the heat dissipation plate 140 may be formed of aluminum. However, materials used to form the heat dissipation plate 140 are not limited thereto and any metallic material having high thermal conductivity including stainless steel and copper may also be used.

The magnetic field shielding sheet 130 and the heat dissipation plate 140 may be formed to satisfy a given relation. For example, the heat dissipation plate 140 may be provided to have a thickness greater than that of the magnetic field shielding sheet 130. When the thickness of the magnetic field shielding sheet 130 is A and the thickness of the heat dissipation plate 140 is B, the thicknesses may satisfy the following relation.

$$0 < A/B < 1 \quad \text{Relation 1}$$

According to the present embodiment, the magnetic field shielding sheet 130 may have a thickness of 0.1 mm and the heat dissipation plate 140 may have a thickness of 1 mm. That is, the thickness of the heat dissipation plate 140 may be greater than that of the magnetic field shielding sheet 130. The thickness of the heat dissipation plate 140 may be at least twice the thickness of the magnetic field shielding sheet 130. However, the present embodiment is not limited thereto and the thicknesses of the magnetic field shielding sheet 130 and the heat dissipation plate 140 may be adjusted within the range satisfying Relation 1 above.

Figure 8:
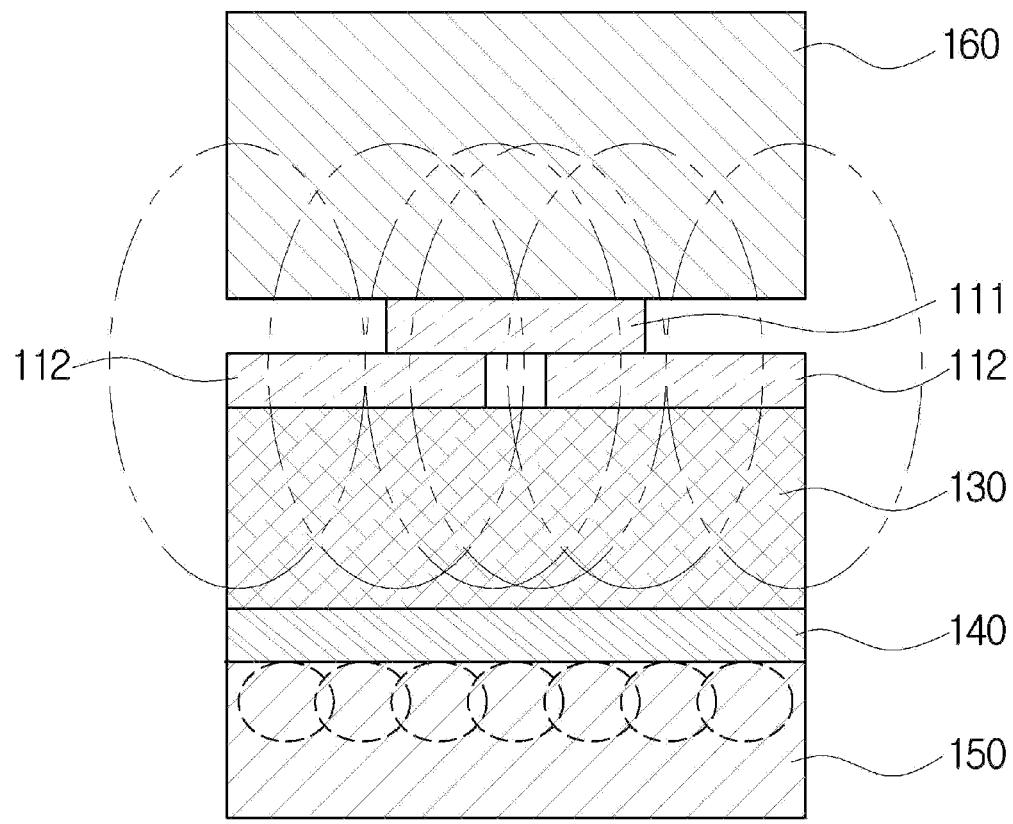
FIG. 8 is a schematic diagram illustrating a wireless charging transmitter module according to the various exemplary embodiments of the present invention.

FIG. 8 is a schematic view illustrating a wireless charging transmitter module 100.

The wireless charging transmitter module 100 may further include a printed circuit board 150 configured to control the operation of the wireless charging transmitter module 100 and a cover 160 configured to define the appearance of the wireless charging transmitter module 100 and accommodate the components of the wireless charging transmitter module 100 in addition to the aforementioned coil devices 111 and 112, the heat dissipation bracket, the magnetic field shielding sheet 130, and the heat dissipation plate 140.

In the case of the wireless charging transmitter module 100 including the printed circuit board 150, electromagnetic interference (EMI) is inevitably caused in the printed circuit board 150 during the operation of the printed circuit board 150. Since the heat dissipation plate 140 is formed of aluminum which is a metal as described above and disposed between the magnetic field shielding sheet 130 and the printed circuit board 150, the transfer of EMI caused in the printed circuit board 150 is blocked by the heat dissipation plate 140. That is, the heat dissipation plate 140 formed of a metallic material also is configured to block the EMI.

Thus, a magnetic field generated in the coil devices 111 and 112 is not disturbed by EMI generated in the printed circuit board 150, preventing a decrease in inductance and an increase in resistance of the coil devices 111 and 112 caused by EMI.

Although the heat dissipation plate 140 is formed to cover the exposed surface of the magnetic field shielding sheet 130 that covers one surface of the heat dissipation bracket 120, the embodiment is not limited thereto.

Figure 9:
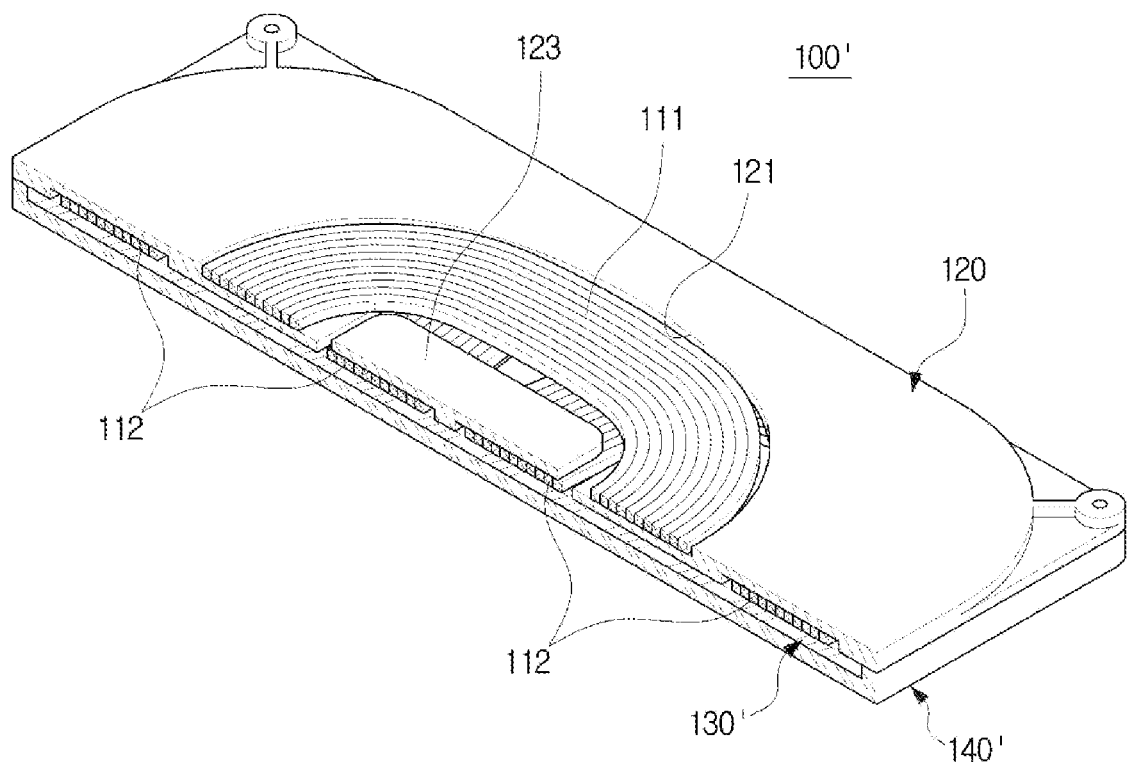
FIG. 9 is a cross-sectional perspective view illustrating a wireless charging transmitter module according to various exemplary embodiments of the present invention.

FIG. 9 is a view illustrating a wireless charging transmitter module 100 according to various exemplary embodiments of the present invention.

A heat dissipation plate 140' according to the various exemplary embodiments is disposed to cover not only an external surface of a magnetic field shielding sheet 130' but also external end portions of the magnetic field shielding sheet 130'. Thus, heat transferred from the external end portions of the magnetic field shielding sheet 130' may be diffused more rapidly.

Also, the magnetic field shielding sheet 130 according to the present embodiment may be separated into a plurality of fine pieces by flake treatment. The magnetic field shielding sheet 130 may also have a multi-layered structure when formed of a thin film magnetic sheet material using an amorphous metal instead of the Ni—Zn ferrite.

The structures of the heat dissipation bracket 120 and the wireless charging transmitter module 100 including the same according to an exemplary embodiment have been described.

According to the aforementioned heat dissipation bracket and the wireless charging transmitter module 100 including the same, the following effects may be obtained.

First, since the coil devices 111 and 112 are disposed to be adjacent to the heat dissipation bracket 120, heat generated by the coil devices 111 and 112 is efficiently removed therefrom. Furthermore, heat generated during the operation of the coil devices 111 and 112 may be removed by applying the heat dissipation bracket 120 having heat dissipation function to the wireless charging transmitter module 100.

Furthermore, since the seating grooves 121 and 122 are formed on one surface and the other surface of the heat dissipation bracket 120, a plurality of coil devices 111 and 112 may be simply aligned in accordance with certified standards, increasing assembly productivity. As the positions of the coil devices 111 and 112 are fixed by the seating grooves 121 and 122, aligned positions of the receiver coil and the transmitter coil are not changed, obtaining uniform charging efficiency.

Hereinafter, test results to evaluate charging efficiencies of the wireless battery charger parts and the heat dissipation abilities thereof will be described. Coil assembly samples were prepared by use of the heat dissipation bracket according to an exemplary embodiment and applied to wireless battery charger parts to measure charging efficiencies and heat dissipation abilities thereof.

The samples were prepared according to Examples 1 and 2 and Comparative Examples 1 and 2 and applied to wireless battery charger parts to measure charging efficiencies thereof.

EXAMPLE 1

A coil assembly sample prepared using an Ni—Zn ferrite film and the heat dissipation bracket according to an exemplary embodiment of the present invention was applied to a wireless battery charger part.

EXAMPLE 2

A coating layer was formed on the surface of the heat dissipation bracket prepared according to Example 1.

COMPARATIVE EXAMPLE 1

A coil assembly sample prepared by fixing coils by injection-molding a SENDUST material was applied to a wireless battery charger part.

COMPARATIVE EXAMPLE 2

A coil assembly sample prepared by attaching coils to an Ni—Zn ferrite film was applied to a wireless battery charger part.

Results of evaluating wireless charging efficiencies and heat generation of the wireless charging transmitter modules 100 to which the samples according to Examples 1 and 2 and Comparative Examples 1 and 2 were applied are shown in Table 1 below.

TABLE 1

| | Charging Efficiency (5 W, %) @800 mA | | | | | Temperature |
| --- | --- | --- | --- | --- | --- | --- |
| | 1 | 2 | 3 | 4 | 5 | (° C.) |
| Example 1 | 51.6 | 51.5 | 51.6 | 51.6 | 51.6 | 41.3 |
| Example 2 | 51.8 | 51.7 | 51.7 | 51.7 | 51.8 | 39.8 |
| Comparative Example 1 | 50.4 | 49.5 | 48.0 | 49.4 | 50.2 | 45.2 |
| Comparative Example 2 | 50.2 | 49.1 | 50.8 | 48.1 | 46.5 | 45.3 |

Based on the test results, it was configured that the samples prepared according to Examples 1 and 2 exhibited lower deviation of charging efficiencies and lower temperatures than those prepared according to Comparative Examples 1 and 2.

As is apparent from the above description, according to the wireless charging transmitter module according to an exemplary embodiment of the present invention, heat generated in the coils may be efficiently diffused and dissipated by use of the heat dissipation bracket and the heat dissipation plate.

Furthermore, since the Ni—Zn ferrite sheet is used as the magnetic field shielding member in the wireless charging transmitter module according to another exemplary embodiment of the present invention, the weight of the wireless charging transmitter module may be reduced while maintaining sufficient magnetic field shielding effects.

For convenience in explanation and accurate definition in the appended claims, the terms "upper", "lower", "internal", "outer", "up", "down", "upper", "lower", "upwards", "downwards", "front", "rear", "back", "inside", "outside", "inwardly", "outwardly", "internal", "external", "internal", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:
1. A wireless charging transmitter module comprising:
a plurality of coil units;
a magnetic field shielding sheet disposed at a side of the plurality of coil units;
a heat dissipation plate attached to a side of the magnetic field shielding sheet; and
a heat dissipation bracket to accommodate the plurality of coil units,
wherein the plurality of coil units comprise a first coil unit disposed on one side of the heat dissipation bracket and a pair of second coil units disposed side by side on another side of the heat dissipation bracket,
wherein the first coil unit and the pair of second coil units overlap each other, wherein the heat dissipation bracket comprises a first seating groove formed in a first surface and accommodating the first coil unit and a pair of second seating grooves formed side by side in a second surface opposite to the first surface and accommodating the pair of second coil units, wherein the first seating groove and the pair of second seating grooves partially overlap each other to form overlap regions, wherein the magnetic field shielding sheet is disposed to cover the second surface of the heat dissipation bracket, wherein the heat dissipation plate is disposed to cover an exposed surface and external end portions of the magnetic field shielding sheet covering the second surface of the heat dissipation bracket, and wherein end portions of the heat dissipation plate to cover the external end portions of the magnetic field shielding sheet is disposed to contact the heat dissipation bracket.

2. The wireless charging transmitter module according to claim 1, wherein the heat dissipation bracket includes graphite.

3. The wireless charging transmitter module according to claim 2, wherein the heat dissipation plate is disposed to cover an exposed surface of the magnetic field shielding sheet covering a surface of the heat dissipation bracket.

4. The wireless charging transmitter module according to claim 1, wherein the magnetic field shielding sheet is formed of an Ni—Zn ferrite sheet, and the heat dissipation plate is formed of a metallic material.

5. The wireless charging transmitter module according to claim 4, wherein the heat dissipation plate is formed of aluminum.

6. The wireless charging transmitter module according to claim 5, wherein a thickness A of the magnetic field shielding sheet and a thickness B of the heat dissipation plate satisfy a relation "$0 < A B < 1$".

7. The wireless charging transmitter module according to claim 6, wherein the magnetic field shielding sheet has a thickness of 0.5 mm or less.

8. The wireless charging transmitter module according to claim 1, wherein at least one portion of the overlap regions is open through the heat dissipation bracket and the first seating groove and the pair of second seating grooves communicate with each other via an open portion.

9. The wireless charging transmitter module according to claim 1, wherein the first seating groove has a depth equal to a thickness of the first coil unit, and the pair of second seating grooves have a depth equal to a thickness of the pair of second coil units.

10. The wireless charging transmitter module according to claim 1, further including a first support portion protruding from the first seating groove to support an internal side of the first coil unit and a pair of second support portions protruding from the pair of second seating grooves to support internal sides of the pair of second coil units.

11. The wireless charging transmitter module according to claim 10, wherein the first support portion has a height equal to a depth of the first seating groove and the pair of second support portions have a height equal to a depth of the pair of second seating grooves.

* * * * *